(12) United States Patent
Roy et al.

(10) Patent No.: US 9,140,629 B2
(45) Date of Patent: Sep. 22, 2015

(54) ASSEMBLY FOR TESTING THE PERFORMANCE OF A COMPONENT

(71) Applicant: ISMECA SEMICONDUCTOR HOLDING SA, La Chaux-de-Fonds (CH)

(72) Inventors: Philippe Roy, Gilley (FR); Thierry Eme, Villers-le-Lac (FR)

(73) Assignee: ISMECA SEMICONDUCTOR HOLDING SA, La Chaux-de-Fonds (CH)

( * ) Notice: Subject to any disclaimer, the term of this patent is extended or adjusted under 35 U.S.C. 154(b) by 0 days.

(21) Appl. No.: 14/411,826

(22) PCT Filed: Jul. 11, 2013

(86) PCT No.: PCT/EP2013/064724
§ 371 (c)(1),
(2) Date: Dec. 29, 2014

(87) PCT Pub. No.: WO2014/067676
PCT Pub. Date: May 8, 2014

(65) Prior Publication Data
US 2015/0233793 A1    Aug. 20, 2015

(30) Foreign Application Priority Data

Nov. 5, 2012   (CH) ........................................ 2248/12

(51) Int. Cl.
*G01R 31/28* (2006.01)
*G01M 99/00* (2011.01)

(52) U.S. Cl.
CPC .......... *G01M 99/008* (2013.01); *G01M 99/004* (2013.01)

(58) Field of Classification Search
CPC ........................... G01R 31/28; G01R 31/2834
USPC ........................................................ 73/118.01
See application file for complete search history.

(56) References Cited

U.S. PATENT DOCUMENTS

| 5,847,293 A | 12/1998 | Jones |
| 6,614,222 B1 * | 9/2003 | Yu et al. .................. 324/756.05 |
| 2007/0080700 A1 * | 4/2007 | Kolman ........................ 324/765 |
| 2010/0256802 A1 * | 10/2010 | Garica et al. .................. 700/218 |

FOREIGN PATENT DOCUMENTS

| EP | 0 716 905 A2 | 6/1996 |
| JP | S61-035531 A | 2/1986 |

* cited by examiner

*Primary Examiner* — Lisa Caputo
*Assistant Examiner* — Jamel Williams
(74) *Attorney, Agent, or Firm* — Maschoff Brennan (57) ABSTRACT

An assembly for testing performance of a component includes a rotatable turret having component handling heads each of which can hold a component and a rotatable head assembly that includes a rotatable head having one or more nests. Each nest has an electrical contact and can receive a component that electrically connects to the nest's electrical contact. Each nest can hold a component that remains electrically connected to the electrical contact, as the head rotates. The rotatable head is adjacent to the turret to pass a component directly from a component handling head on the turret to a nest on the head. A processor is in electrical communication with the electrical contact(s) of the nests such that the processor can send command signals to a component held in a nest and receive response signals from the component. The processor determines the performance of the component from the response signals.

15 Claims, 9 Drawing Sheets

ASSEMBLY FOR TESTING THE PERFORMANCE OF A COMPONENT

FIELD OF THE INVENTION

The present invention concerns an assembly for testing the performance of a component, and in particular for testing the performance of a component while the component is moving and/or being accelerated or decelerated.

DESCRIPTION OF RELATED ART

Electrical components are required to operate in many different environments. In certain cases electrical components are required to operate while moving; the performance of a component which is moving may differ to its performance when the component is stationary. Therefore, it is desirable if the performance of the component while it is in motion can be tested, to determine if that component is suitable for certain applications.

When testing the electrical performance of the component while the component is in motion, it is important that electrical communication with the component is maintained as the component is moved. This requires that the component maintains electrical connection with electrical contacts as it is moved. Existing means for holding components in contact with electrical contacts are not sufficient to hold components in contact with electrical contacts when moving at high speeds.

Typically, a plurality of testing/processing stations will define an assembly line for component processing or component testing. These testing/processing stations are typically located at the periphery of a rotatable turret. The rotatable turret comprises component handling heads which can carry components and the turret intermittently rotates to transport components between successive testing/processing stations. As the components are processed/tested at each station the turret must be stopped; the overall processing time of the assembly is dictated by the slowest processing/testing station. It desirable to minimise testing/processing time of each station so that the overall processing time of the assembly is minimised.

A component which forms part of a device may be submerged in parasitic magnetic field which is generated by other components in the device. The performance of a component may be affected by the presence of a magnetic field. Therefore, for many applications, it is desirable if the performance of the component in the presence of a magnetic field can be determined.

It is an aim of the present invention to mitigate or obviate at least some of the above-mentioned disadvantages or difficulties.

SUMMARY OF THE INVENTION

According to the present invention there is provided an assembly for testing performance of a component, the assembly comprising, a rotatable turret which comprises a plurality of component handling heads each of which can hold a component;

a rotatable head assembly, the rotatable head assembly comprising, a rotatable head, wherein the rotatable head comprises one or more nests, each of which has an electrical contact, and each of which is suitable for receiving a component such that the component can electrically connect to the electrical contact of that nest;

wherein the nest is further configured such that it can hold a component such that the component remains electrically connected to the electrical contact, as the rotatable head rotates;

wherein the rotatable head is arranged to be adjacent the turret so that a component can be passed directly from a component handling head on the rotatable turret to a nest on the rotatable head;

a processor which is arranged in electrical communication with the electrical contact(s) of the one or more nests on the rotatable head such that the processor can, both, send command signals to a component held in a nest which cause the component to operate in a predefined manner, and receive response signals from the component which are generated by the component when the component operates in the predefined manner, while the component is rotated by the rotatable head, and wherein the processor is configured to determine the performance of the component from the response signals it receives.

Preferably the rotatable head assembly is arranged such that the rotatable head is positioned under the rotatable turret so that a component can be passed directly from a component handling head on the rotatable turret into a nest on the rotatable head. In such a configuration the component can be dropped directly from a component handling head on the rotatable turret into a nest on the rotatable head.

The rotatable head may be arranged such that it can be rotated so that a nest on the rotatable head is aligned with a component handling head on the rotatable turret.

The determine performance may be the electrical performance of the component. Preferably, the component is an electrical component.

The rotatable head may comprise a two or more nests. For example, the rotatable head may comprise four nests. The two or more nest may be positioned symmetrically on the rotatable head.

The rotatable head may be configured to have a single axis of rotation only.

The processor may be further configured to derive, from the determined performance of the component, the performance of the component if it were moved in one or more linear directions. For example, the processor can derive from the determined performance, how the component would perform if it were to be moved along the horizontal normal or vertical normal.

The rotatable head assembly may further comprise an actuator for rotating the rotatable head. The actuator may be a servo motor.

The rotatable head assembly may further comprise a controller which is operable to control the speed of rotation of the rotatable head. For example the controller may be arranged in communication with an actuator which actuates rotation of the rotatable head so that the speed of rotation of the rotatable head can be controlled. This will enable the rotational head to be accelerated and/or decelerated. Thus the performance of the component while it is being accelerated and/or decelerated may also be determined. Of course the controller may also operate the actuator so that it rotates the rotational head at a constant speed.

The rotatable head assembly may define one of a plurality of testing stations which are arranged at a periphery of the rotational turret. The rotational turret may be configured to intermittently rotate to transport components between the plurality of testing stations.

The rotation of the rotatable head is preferably synchronized with the rotation of the turret, so that the performance of components is determined, during the periods in which turret is stopped.

The nest may comprise, a fixed part, and a movable part, wherein the fixed part and movable part are configured to cooperate so as to define a pocket which can receive at least a part of a component, wherein the movable part is moveable between a first position and a second position, wherein in the first position the pocket is open so that at least part of the component can be moved into the pocket and establish electrical connection with an electrical contact of the nest, and in the second position the pocket is closed so that the at least part of the component positioned in the pocket can be secured within the pocket, wherein the nest further comprises a biasing means which is arranged to bias the movable part towards its second position so that a component can be maintained electrically connected to the electrical contact provided in the nest, as the rotatable head rotates When the moveable part is moved to its first portion, the dimensions of the pocket are increased, so that a component can be easily moved into the pocket to establish electrical connection to an electrical contact of the nest. When the moveable part is moved to its second portion, the dimensions of the pocket are decreased, so that a component is secured within the pocket. When the moveable part is moved to its second portion the pocket is closed; when the pocket is closed the component is secured within the pocket of the nest so that it remains electrically connected to the electrical contacts even when it rotated by the rotatable head. The component may be secured by, for example, the component may be clamped between the moveable part and fixed part, the moveable part may comprise an extension which engages or covers a part of the component when the moveable part is in its section position, so that the component is retained in the pocket, the frictional force between the moveable part and component and fixed part and component may be such that the component is retained in the pocket.

The moveable part may be configured so that it can abut a component at least part of which is located in the pocket, to frictionally engage the electrical component, when the moveable part is in its second position, such that frictional force between the moveable part and the component secures the component within the pocket.

The moveable part may comprise an extending member which is configured such that it can abut a component at least part of which is located in the pocket, when the moveable part is in its second position, such that frictional force between the extending member and the component secures the component within the pocket.

The moveable part may comprise an extending member which is configured such that it can abut a component located in the pocket, when the moveable part is in its second position, such that the frictional force between the extending member and the component secures the component within the pocket.

The component may be an LED. The fixed part and movable part may be configured to cooperate to define a pocket which is suitable for receiving at least part of an LED. The component may be a silicon chip. The fixed part and movable part may be configured to cooperate to define a pocket which is suitable for receiving at least part of a silicon chip.

Preferably the fixed part and movable part are configured to cooperate to define a pocket which is suitable for receiving a part of a component while leaving another part of the component exposed. For example, the fixed part and movable part may be configured to cooperate to define a pocket which is suitable for receiving the electrical contacts of an LED while leaving a lens portion of the LED protruding from the pocket so it is exposed for testing.

The fixed part may comprise one or more projections which define one or more walls of the pocket. The fixed part may comprise three projections which define three walls of the pocket.

The moveable part may be configured to define one or more other walls of the pocket. The moveable part may be configured to define a fourth wall of the pocket.

The fixed part may comprise an aperture which can receive the one or more projections which are provided on the fixed part. At least the length dimensions of the aperture may be larger than the length dimensions of the one or more projections on the fixed part so that the moveable part can move relative to the fixed part when the one or more projections on the fixed part are received in the aperture of the moveable part.

The biasing means may comprise at least one flexible blade.

The movable part may be arranged to cooperate with the flexible blade such that movement of the movable part to its first position causes the at least one flexible blade to flex.

The elastic force of the flexed blade will bias the moveable part towards its second position.

The movable part and at least one flexible blade are arranged so that when the moveable part is in the second position the flexible blade is flexed, so that a biasing force is applied to the moveable part when in its second position, so that a component located within the pocket is clamped between the moveable part and fixed part to secure the component in the pocket.

The movable part may comprise one or more projections which is/are arranged to cooperate with the flexible blade such that when the movable part is moved to its first position the projections push against the blade to flex the blade.

Preferably, the one or more projections is/are arranged to abut the flexible blade.

The nest may comprise, a first blade which comprises a first end and second end, wherein the first end is fixed to the fixed part of the nest and a second end which is a free end so that it can flex, and a second blade which comprises a first end and second end, wherein the first end it fixed to the fixed part of the nest and a second end which is a free end so that it can flex.

The movable part may comprise, a first projection which cooperates with the first blade proximate to the free end of the first blade, and a second projection which cooperates with the second blade proximate to the free end of the second blade, so that movement of the moveable part towards its first position will cause flexion of the first and second blades.

The nest may comprise a flexible blade which is configured to be secured to the fixed portion at a centre point along the length of the blade, leaving the ends of the blade free to flex. One or more projections on the moveable part may be arranged to cooperate with the blade at a position which is proximate to the ends of blade which are free to flex.

The nest may further comprise a guide means which can guide the movement of the movable part as it moves between the first and second positions. Preferably, the guide means comprises one or more projection members on the fixed which engage one or more tracks on the moveable part. Alternatively the guide means may comprise one or more projection members on the moveable part which engage one or more tracks on the fixed part. It will be understood that any suitable guide means could be used.

The nest may further comprise a heating means, which is configured to be in thermal communication with the pocket such that the heating means can heat a component held in the pocket. Preferably the heating means comprises one or more heating elements which are integrated within the nest.

The moveable part may further comprise a surface which is arrangeable to cooperate with a cam of an actuator so that movement of the cam can effect movement of the moveable part between its first and second positions. Preferably, the moveable part comprises a ledge, which extends beyond an edge of the fixed part, and wherein the ledge comprises a surface which is suitable for cooperating with a cam of an actuator, so that movement of the cam will effect movement of the moveable part between its first and second positions. The surface which is suitable for cooperating with a cam of an actuator is preferably a side face of the ledge. The side face of the ledge is preferably substantially horizontal.

The rotatable head assembly may further comprise one or more actuators for operating the one or more nests on the rotatable head. The rotatable head assembly preferably comprises a single actuator for operating the one or more nests on the rotatable head.

The actuator may comprise a cam in the form of an eccentric cam which is arranged to cooperate with a surface of the moveable part of the nest, so that rotation of the cam will effect movement of the moveable part between its first and second positions and wherein the actuator further comprises a motor which is operable to rotate the cam. The motor may be a stepper motor.

The assembly for testing performance of a component, may further comprise a magnetic testing station, the magnetic testing station comprising, an electromagnet which is operable by current to provide an magnetic field;

a carriage, which comprises a nest which has an electrical contact and which is suitable to hold a component in electrical connection with the electrical contact of that nest, and wherein the carriage is movable to carry a component received in the nest, to a region where the component is submerged in a magnetic field generated by the electromagnet;

a processor which is arranged in electrical communication with the electrical contact of the nest on the carriage such that the processor can, both, send command signals to a component held in the nest which cause the component to operate in a predefined manner, and receive response signals from the component which are generated by the component when the component operates in the predefined manner, while the component is submerged in the magnetic field, and wherein the processor is configured to determine the performance of the component from the response signals it receives.

The carriage is preferably configured such that it can be positioned adjacent to the turret so that a component can be passed directly from a component handling head on the rotatable turret to a nest on carriage. Preferably the carriage is configured such that it can be positioned under the turret so that a component can be dropped directly from a component handling head on the rotatable turret onto the nest on carriage.

The region to which the carriage carries the component, is preferably a region within the electromagnet.

Preferably the determined performance is the electrical performance of the component. Preferably the component is a component.

The nest may have some or all of the features of the nest mentioned earlier.

The magnetic testing station may further comprise a means for adjusting the strength of the magnetic field. The means for adjusting the strength of the magnetic field may comprise a means for adjusting the magnitude of current which is conducted in an electrical coil of the electromagnet.

The magnetic testing station may comprise an actuator for operating the nest on the carriage. The actuator may comprise a cam in the form of an eccentric cam which is arranged to cooperate with a surface of the moveable part of the nest, so that rotation of the cam will effect movement of the moveable part between its first and second positions and wherein the actuator further comprises a motor which is operable to rotate the cam. The motor may be a stepper motor.

A method of testing the performance of a component comprising the steps of, transferring a component to be tested, from a handling head on a rotatable turret, directly to a nest on a rotatable head which is arranged adjacent the turret, so that the component establishes electrical connection with an electrical contact provided in the nest;

operating the nest to hold the component so that the component remains electrically connected to the electrical contact as the rotatable head rotates;

rotating the rotatable head at a predetermined speed;

operating a processor which is arranged in electrical communication with the electrical contact of the nest, such that the processor sends command signals to the component held in the nest, to cause the component to operate in a predefined manner, and receiving at the processor, response signals from the component which are generated by the component when the component operates in the predefined manner, while the component is rotated by the rotatable head, determining the performance of the component from the response signals the processor receives.

Preferably the determined performance is the electrical performance of the component. Preferably the component is a component.

The method may further comprise the step of rotating the rotatable head about a single axis of rotation only.

The method may further comprise the step of rotating the rotatable head such that a nest on the rotatable head is aligned with a component handling head on the rotatable turret. Preferably the nest on a rotatable head which is positioned directly under a handling head on the turret.

The method may further comprise the steps of operating the processor to derive, from the determined performance of the component, the performance of the component if it were to be moved along one or more linear directions. For example, the processor can derive from the determined performance, how the component would perform if it were to be moved along the horizontal normal or vertical normal.

The method may further comprise the step of adjusting the speed of rotation of the rotatable head so that the performance of the component at different speeds can be determined.

The method may further comprise the step of accelerating the rotatable head so that the performance of the component while it is being accelerated can be determined.

The method may further comprise the step of decelerating the rotatable head so that the performance of the component while it is being decelerated can be determined.

The method may comprise the step of rotating the rotatable head at a constant speed so that the performance of the component while it is moving at a constant speed can be determined.

The rotatable turret may be configured to intermittently rotate to transport components between testing stations and where the above method is successively performed on successive components during the period in which the turret is stopped. The method may comprise the step of synchronizing the method of testing the performance of a component with the intermittent rotation of the rotatable turret, so that the method is executed during intervals in which the rotatable turret is stopped. The method may comprise the step of synchronizing the rotation of the rotatable head with the intermittent rotation of the rotatable turret, so that the method is executed during intervals in which the rotatable turret is stopped.

The method may comprise the step of securing the component in a nest according to any one of the above-mentioned nests, comprising the step of, moving the moveable part to its first position against the biasing means, positioning at least part of a component into the pocket, moving the moveable part to its second position using the biasing means so that the component, at least part of which is located in the pocket, is secured within the pocket.

Preferably, the method comprises moving the moveable part to its second position using the biasing means so an extending member on the moveable part abuts the component located in the pocket, so that frictional forces between the extending member and the component secures the component within the pocket. The method may comprise moving the moveable part to its second position so that frictional forces between the extending member and the component, and between the fixed portion and the component, secures the component within the pocket The method may comprise the step of apply a biasing force to the movable part using the biasing means so that the component is clamped between the moveable part and fixed part to secure the component within the pocket.

The method of testing the performance of a component may further comprise the steps of, transferring a component to be tested, from a handling head on a rotatable turret, directly to a nest on a carriage which is positioned adjacent the turret, so that the component establishes electrical connection with an electrical contact provided in the nest;

operating the nest to hold the component;

operating an electromagnet to generate an predetermined magnetic field;

moving the carriage so that the component is carried by the carriage into a region where it is submerged in the generated magnetic field;

operating a processor which is arranged in electrical communication with the electrical contact such that the processor sends command signals to the component held in a nest which cause the component to operate in a predefined manner, and receiving at the processor, response signals from the component which are generated by the component when the component operates in the predefined manner, while the component is submerged in the generated magnetic field, determining the performance of the component from the response signals the processor receives.

The method may further comprise the step of adjusting or varying the strength of the magnetic field. The method may comprise the step of adjusting or varying the strength of the magnetic field by adjusting the magnitude of current which is conducted in an electrical coil of the electromagnet.

BRIEF DESCRIPTION OF THE DRAWINGS

The invention will be better understood with the aid of the description of embodiments, which is given by way of example only, and illustrated by the figures, in which.

DETAILED DESCRIPTION OF POSSIBLE EMBODIMENTS OF THE INVENTION

Figure 1:
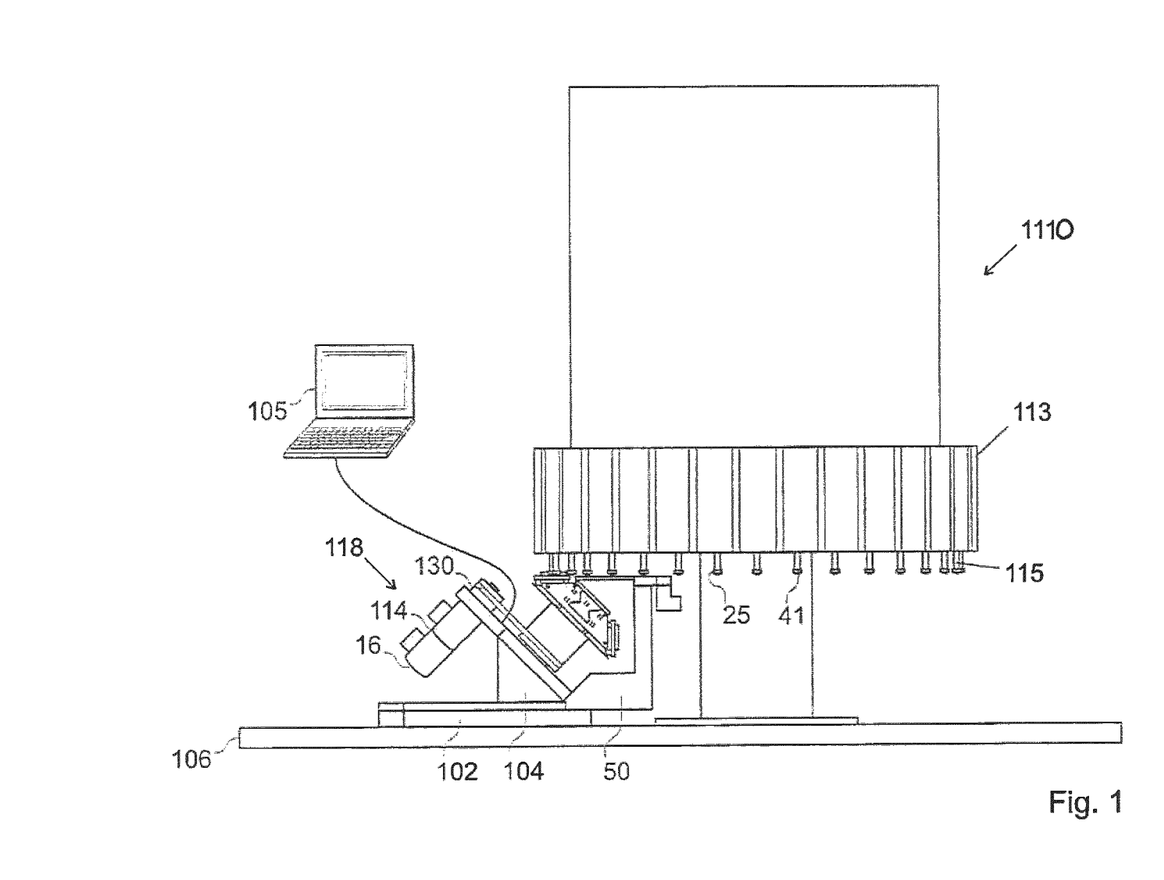
FIG. 1 provides a perspective view of an assembly for testing the performance of components, according to an embodiment of the present invention.

FIG. 1 provides a perspective view of an assembly 1110 for testing the performance of components, according to an exemplary embodiment of the present invention. Specifically, the assembly 1110 is suitable for testing the performance of electrical components 25 while the electrical components 25 are moving at high speeds, or while they are being accelerated or decelerated.

The assembly 1110 comprises a rotatable turret 113 which comprises a plurality of component handling heads 115. Each of the component handling heads 115 are configured such that they can hold an electrical component 25; for example each of the component handling head 115 may be configured such that they can hold an electrical component 25 by means of suction/vacuum. Of course each of the component handling head 115 can be operated to selectively release the electrical component 25 which they hold.

Figure 2:
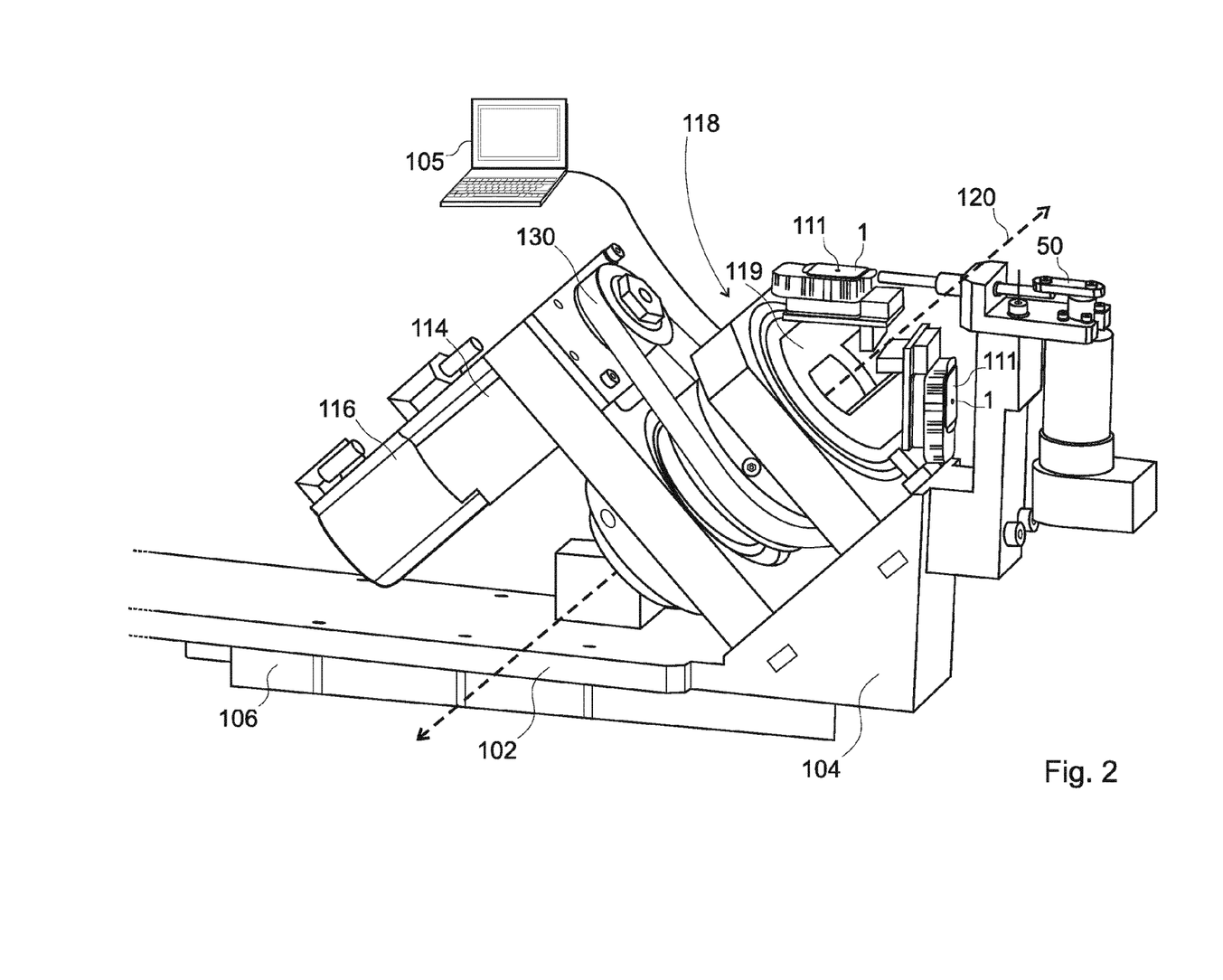
FIG. 2 provides a magnified view of a rotational head assembly used in the assembly shown in FIG. 1.

The assembly 1110 further comprises a rotatable head assembly 118 which is anchored to a base platform 106 by means of an anchoring plate 102. FIG. 2 provides a magnified view of the rotatable head assembly 118. The rotatable head assembly 118 comprises a rotatable head 119. The rotatable head 119 is configured to have a single axis of rotation 120 only. This allows for a simpler design of the rotatable head assembly 118. An actuator in the form of a servo motor 114 is connected to the rotatable head 119 by means of a belt 130 and it operable to rotate the rotatable head 119.

As can be seen in FIG. 2 the rotatable head 119 comprises two nests 1, each nest 1 each suitable for receiving an electrical component 25. The rotatable head assembly 118 is arranged under the turret 113. FIG. 1 shows that the rotatable head assembly 118 is arranged such that a nest 1 on the rotatable head 119 is aligned with a component handling head 115 on the rotatable turret 113. Such an arrangement will allow an electrical component 25 to be passed directly from a component handling head 115 on the rotatable turret 113 to a nest 1 on the rotatable head 119. A bracket 104, preferably a 45° bracket, is used to ensure that each nest 1 is horizontal normal when the nest 1 is aligned under a component handling head 115. When the nest 1 is horizontal the nest 1 will lay on a plane which is parallel to a plane defined by an electrical component 25 held on the component handling head 115, or the nest 1 will be parallel to the surface of the base platform 106.

It will be understood that the rotatable head 119 could be provided with any suitable number of nests 1. As shown in FIG. 2 each nest 1 further comprises electrical contacts 111 which are arranged such that electrical contacts 41 (see FIG. 1) of an electrical component 25 which is held in a nest 1 can establish an electrical connection with the electrical contacts 111 provided in the nest 1. Each nest 1 is further configured such that it can hold an electrical component 25 in a fixed position as the rotatable head 119 rotates; more precisely each nest 1 is configured such that it can hold an electrical component 25 in a position whereby the electrical contacts 41 of the electrical component 25 remain electrically connected to the electrical contacts 111 provided in the nest 1, as the rotatable head 119 rotates.

The rotatable head assembly 118 further comprises an actuator 50 which cooperates with a nest 1 to open and close the nest so that an electrical component 25 can be received and secured respectively in the nest; the cooperation of the actuator 50 and nest 1 will be discussed in more detail later.

Referring again to FIG. 1, the assembly 1110 is shown to further comprise a processor 105. The processor 105 is arranged in electrical communication with the electrical contacts 111 provided in each nest 1 such that the processor 105 can send and receive electrical test signals to/from an electrical component 25 held in a nest 1, while the electrical component 25 is rotated by the rotatable head 119. The test signals may, for example, comprise electrical command signals which the processor 105 sends to the electrical component 25 to initiate the electrical component 25 to operate in a particular manner or to perform a certain predefined task. The processor 105 may in turn receive electrical response signals from the electrical component 25; the electrical response signals may be signals which are generated by the electrical component 25 when the electrical component 25 is operating or performing the predefined task which was initiated by the electrical command signal. The electrical response signals are used by the processor 105 to determine how the electrical component 25 is performing while it is rotated by the rotatable head 119.

The processor 105 is further configured to derive, from the determined electrical performance of the electrical component 25, how the electrical component 25 would perform if it was to be moved in one or more linear directions. For example, the processor 105 can derive, from the determined electrical performance, how electrical component 25 would perform if it was moved along the horizontal normal or vertical normal.

The rotatable head assembly 118 further comprises a controller 116 which is arranged in operable communication with the servo motor 114, for controlling the speed of rotation of the rotatable head 119. This will enable the rotational head 119 to be accelerated and/or decelerated. Thus, the performance of the electrical component 25 while it is being accelerated and/or decelerated may also be determined. Of course the controller 116 may also operate the rotational head 119 to rotate at a constant speed.

Figure 3:
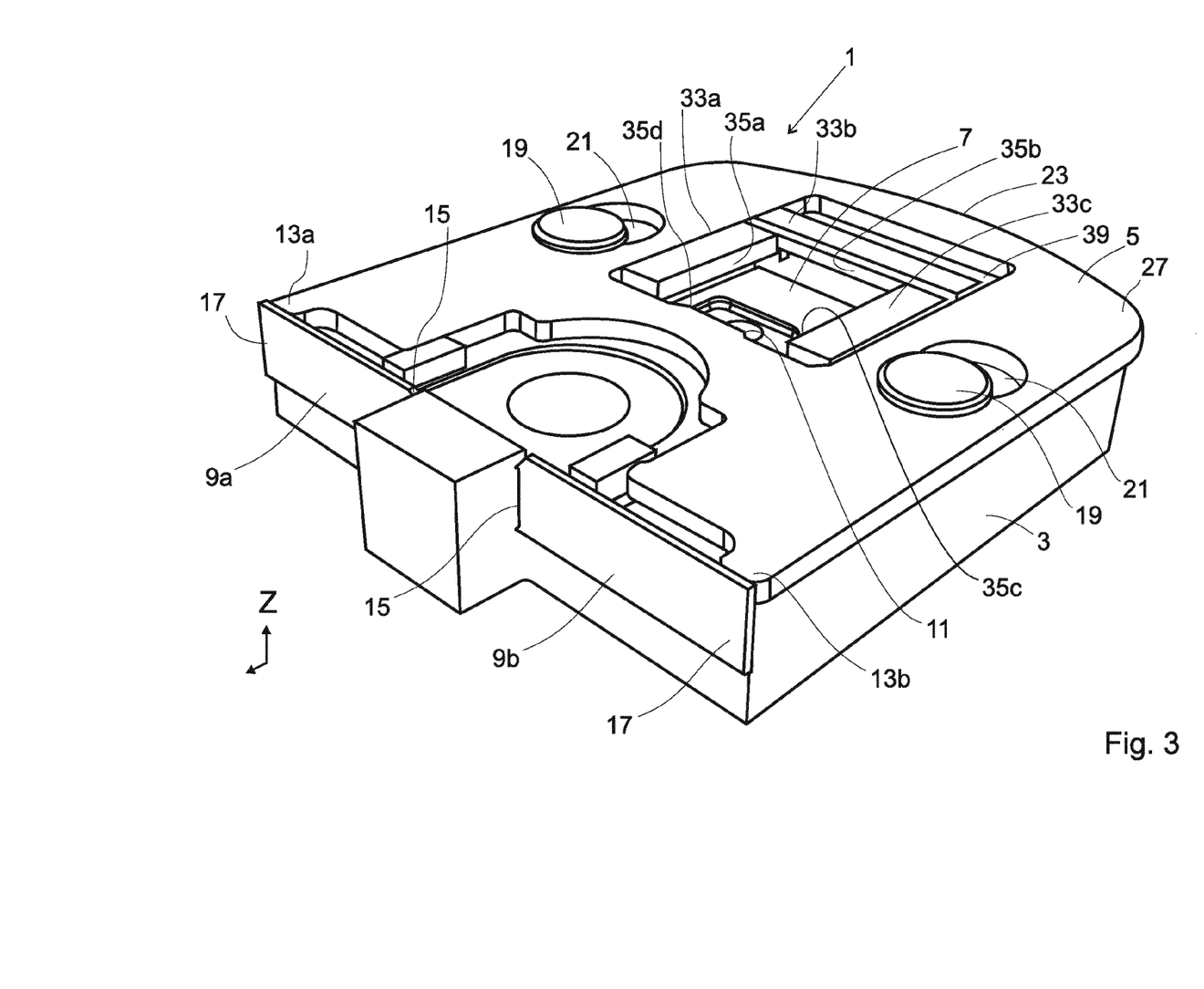
FIG. 3 shows a perspective view of an exemplary nest provided on in the rotational head of the rotational head assembly shown in FIG. 2.
Figure 4:
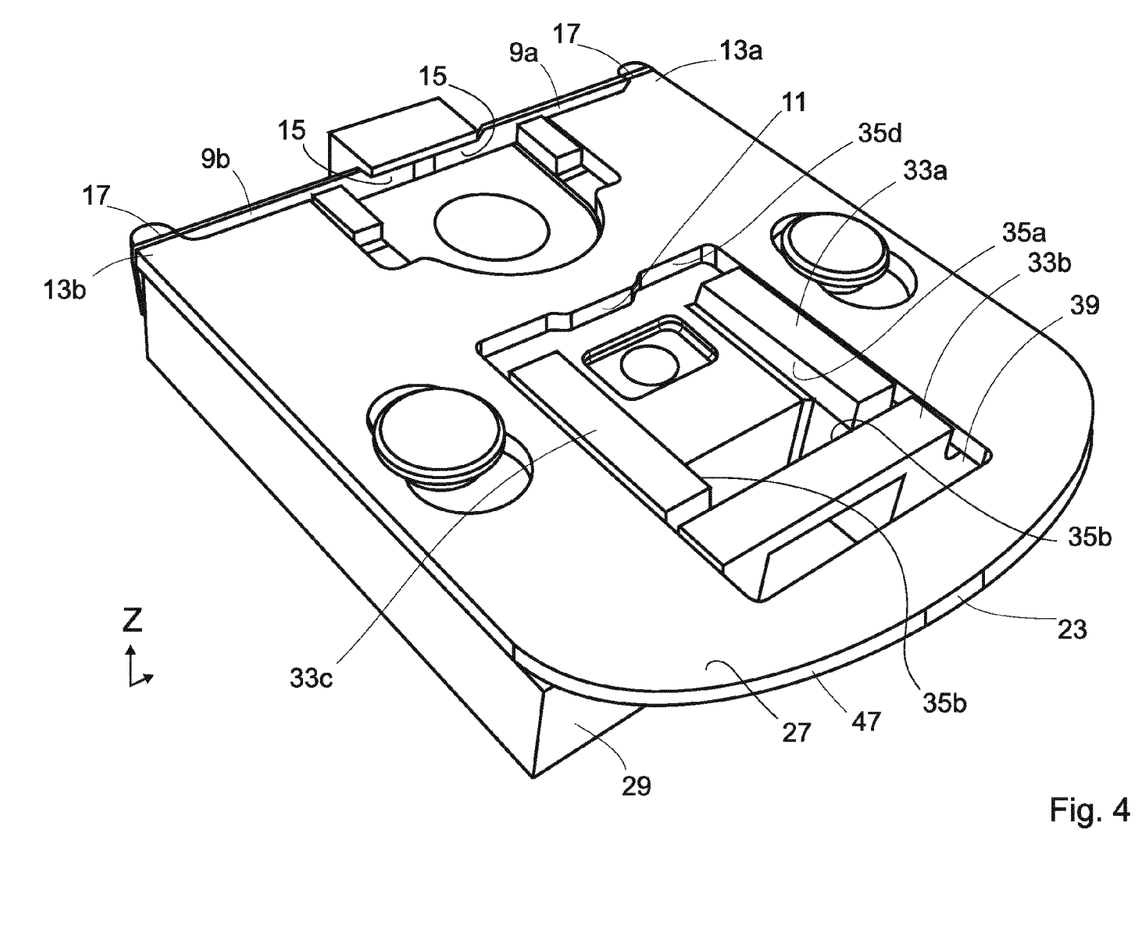
FIG. 4 shows a further perspective view of the nest shown in FIG. 3.
Figure 5:
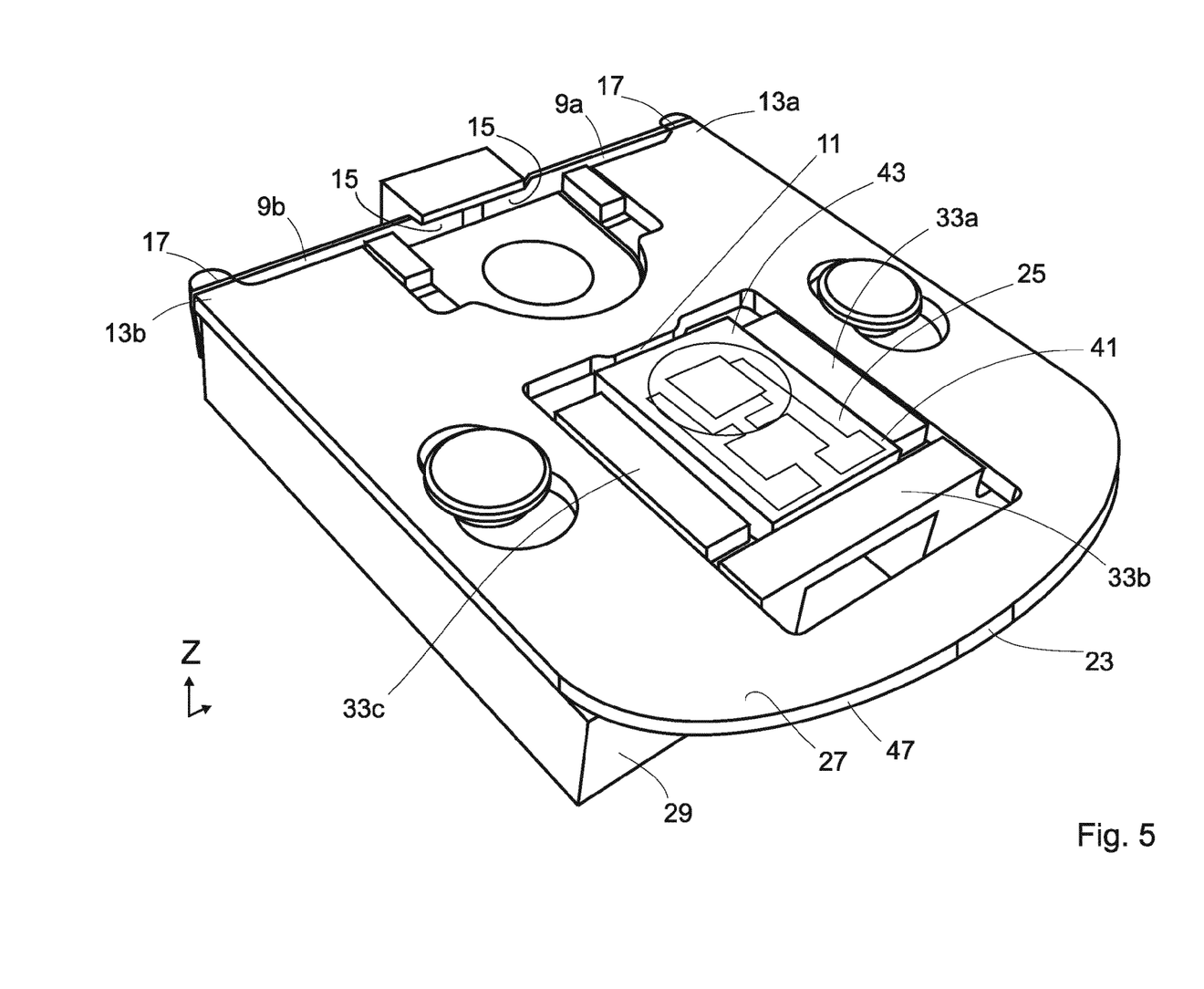
FIG. 5 shows a further perspective view of the nest shown in FIG. 3, with a component secured in the nest.

The ability to hold a the electrical component 25 such that electrical contacts 41 of the electrical component 25 remain electrically connected to the electrical contacts 111 provided in the nest 1 as the rotatable head 119 rotates, is due to the features of the nest 1. Referring to FIGS. 3-5, there is shown perspective views of the exemplary nest 1 provided on the rotatable head 119 of the rotatable head assembly 118 shown in FIG. 2.

The nest 1 comprises a fixed part 3 and a movable part 5, wherein the fixed part 3 and movable part 5 are configured to cooperate so as to define a pocket 7. The pocket 7 is suitable for receiving an electrical component 25 (such as an LED or Silicon chip), or at least part of an electrical component 25.

The fixed part 3 comprises three members 33a-c which define three walls 35a-c of the pocket 7; the moveable member 5 defines a fourth wall 35d of the pocket 7. The three members 33a-c are arranged to protrude through a recess 39 provided in the moveable member 5; the recess 39 is dimensioned to extend longer than the three walls 35a-c so as to permit the moveable member 5 to move relative to the fixed part 3.

The movable part 5 is moveable between a first position and a second position. FIG. 4 illustrates the movable part 5 in its first position; when the movable part 5 is in the first position the dimensions of the pocket 7 of the nest 1 are at a maximum so that an electrical component 25 can be easily moved into the pocket 7. When the movable part 5 is in the first position the pocket 7 is "open". FIG. 5 illustrates the movable part 5 in its second position; when the movable part 5 is in the second position the dimensions of the pocket 7 of the nest 1 are at a minimum so that at least the length dimension of the pocket 7 matches the length of a electrical component 25 positioned within the pocket 7, so that the electrical component is secured within the pocket 7 so as not to move when the rotatable head 119 rotates. When the movable part 5 is in the second position the pocket 7 is "closed". When the pocket 7 of the nest is "closed" the electrical component 25 will be secured in the nest 1 so that its electrical contacts 41 of the electrical component 25 remain in electrical connection with the electrical contacts 111 provided in the nest 1, as the rotatable head 119 is rotated.

FIG. 5 shows an electrical component 25 secured within the pocket 7. Optionally the electrical component 25 may be an LED or a silicon chip; if the electrical component 25 is an LED the optionally the pocket 7 may be configured to receive electrical contacts 41 of the LED while leaving a lens portion of the LED exposed for performance testing.

The part of the moveable part 5 which defines the fourth wall 35d of the pocket 7 comprises an extending member 11 which is configured such that it can abut the electrical component 25 located in the pocket 7, when the moveable part 5 is in its second position. When the extending member 11 abuts the electrical component 25 located in the pocket 7, frictional forces between the extending member 11 and the electrical component 25 and between the electrical component 25 and the three members 33a-c of the fixed portion 3, secures the electrical component 25 within the pocket 7.

The nest 1 further comprises a biasing means in the form of first and second flexible blades 9a,b which are arranged to bias the movable part 5 towards its second position. The first blade 9a comprises a first end 15 and second end 17; the first end 15 is fixed to the fixed part 3 of the nest 1 and the second end 17 is a free end so that it can flex. The second blade 9b also comprises a first end 15 and second end 17, wherein the first end 15 is fixed to the fixed part 3 of the nest 1 and a second end 17 is a free end so that it can flex.

The movable part 5 is arranged to cooperate with the first and second flexible blades 9a,b such that movement of the movable part 5 to its first position causes the first and second flexible blades 9a,b to flex. The movable part 5 comprises two projections 13a,b each of which is arranged to abut with first and second flexible blades 9a,b respectively. The first projection 13a abuts with the first blade 9a at a position which is proximate to the free end 17 of the first blade 9a, and a second projection 13b abuts the second blade 9b at a position which is proximate to the free end 17 of the second blade 9a, so that movement of the moveable part 5 towards its first position will cause flexion of the first and second blades 9a,b. The elastic force of flexed first and second flexible blades 9a,b will bias the moveable part 5 towards its second position.

Also, optionally, the movable part 5 and first and second flexible blades 9a,b may be arranged so that when the moveable part 5 is in its second position the first and second flexible blades 9a,b are flexed, so that a biasing force is applied to the moveable part 5 when in the moveable part 5 is in its second position. Applying a biasing force to the moveable part 5 when it is in its second position, will enable clamping of an electrical component 25 which is located within the pocket 7, between the moveable part 5 and fixed part 3; clamping of the electrical component 25 will ensure that it is held more securely within the pocket 7.

The nest 1 further comprises a guide means 19,21 which can guide the movement of the movable part 5 as it moves between the first and second positions. In this particular example the guide means 19,21 comprises two projection members 19 which are fixed to the fixed part 3 of the nest 1, and two tracks 21 which are provided in the moveable part 5. The projection members 19 engage the tracks 21, and move along the tracks 21 as the moveable member 5 moves between the first and second positions. It will be understood that any number of projection members 19 and tracks 21 could be provided. It will be understood that any suitable guide means could be used; for example, it will be understood that alternatively the guide means may comprise one or more projection members 19 on the moveable part 5 which engage one or more tracks 21 on the fixed part 3.

The moveable part 3 further comprises a ledge 27, which extends beyond an end 29 of the fixed part 3. The ledge 27 comprises a surface 23 which is suitable for cooperating with a cam of an actuator (not shown in FIG. 4 or 5), so that movement of the cam will effect movement of the moveable part 5 between its first and second positions. As can be seen from FIGS. 4 and 5 the surface 23 which is suitable for cooperating with a cam of an actuator is provided on a face 47 of the ledge 27; and the surface 23 is configured to be substantially horizontal.

Various modifications and variations to the nest 1 will be apparent to those skilled in the art. For example, alternatively, or additionally, the nest 1 may comprise a flexible blade which is configured to be secured to the fixed portion 3 at a centre point along the length of the blade, leaving the ends of the blade free to flex. The two projections 13a,b on the moveable part may be arranged to cooperate with the blade at a position which is proximate to the ends of blade which are free to flex. Optionally the nest 1 may further comprise a heating means (not shown), which is configured to be in thermal communication with the pocket 7 such that the heating means can heat an electrical component 25 located in the pocket 7. Preferably, the heating means would comprise one or more heating elements (not shown) which are integrated within the nest 1.

Figure 6:
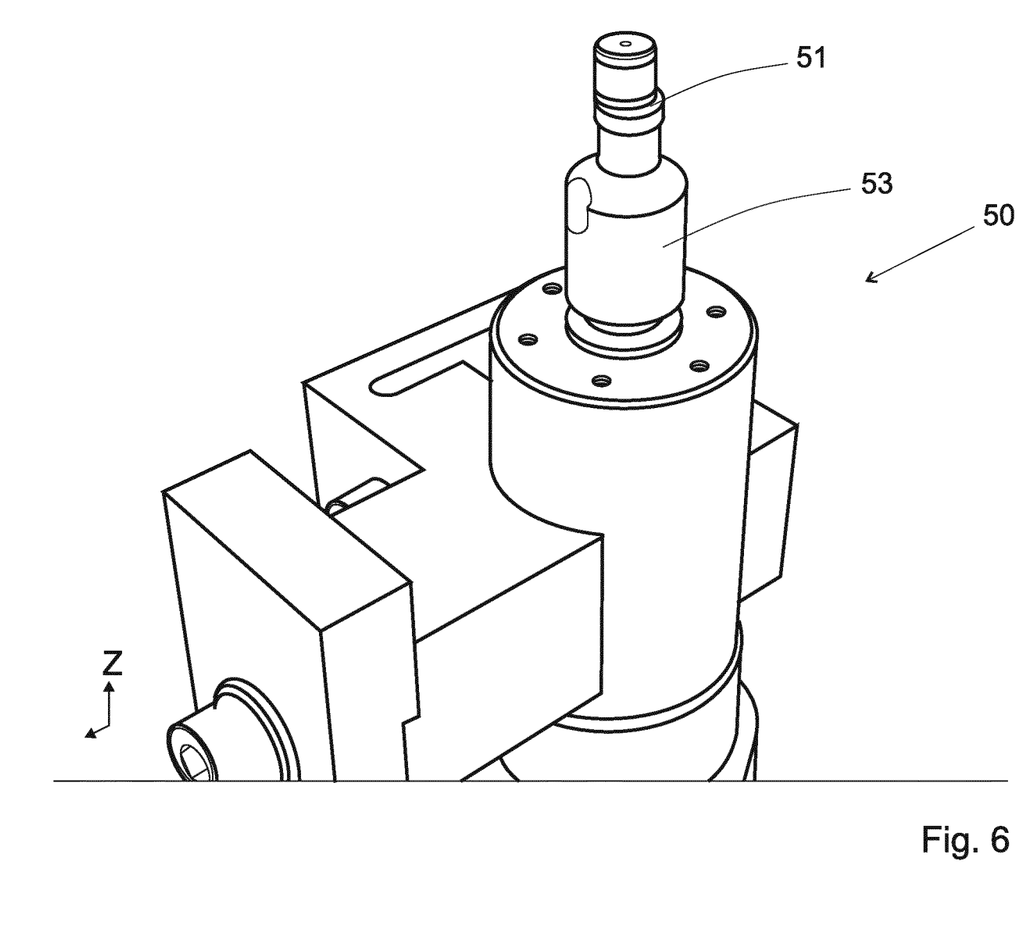
FIG. 6 shows a perspective view of an actuator which can cooperate with the nest shown in FIGS. 3-5 to move the moveable part of the nest.

FIG. 6 provides a perspective view of the actuator 50 which is provided in the rotatable head assembly 118. The actuator 50 is suitable for cooperating with a nest 1 provided on the rotatable head 119, to move the moveable member 5 of the nest 1 between its first and second positions. Thus, the actuator 50 is operable to selectively open the nest so that the nest 1 can respectively receive an electrical component 25 directly from a handling head 115 of the turret 113, and is operable to selectively close the nest 1 so that the received electrical component is secured in the nest 1 so that it will remain electrically connected to electrical contacts 111 provided in the nest 1 as the rotatable head 119 is rotated.

The actuator 50 comprises a cam 51, in the form of an eccentric disc 51, which is arrangeable to abut with the surface 23 of the moveable part 5 of the nest 1, so that rotation of the cam 51 will effect movement of the moveable part 5 between its first and second positions.

The actuator 50 further comprises a motor 53 which is operable to rotate the cam 51. The motor 53 is preferably a stepper motor.

The actuator 50 should be arranged so that its cam 51, which in this case is in the form of an eccentric disc 51, abuts with the surface 23 of ledge 27 of the of the moveable part 5. As the eccentric disc 51 rotates it will effect movement of the moveable part 5 between its first and second positions.

Figure 7:
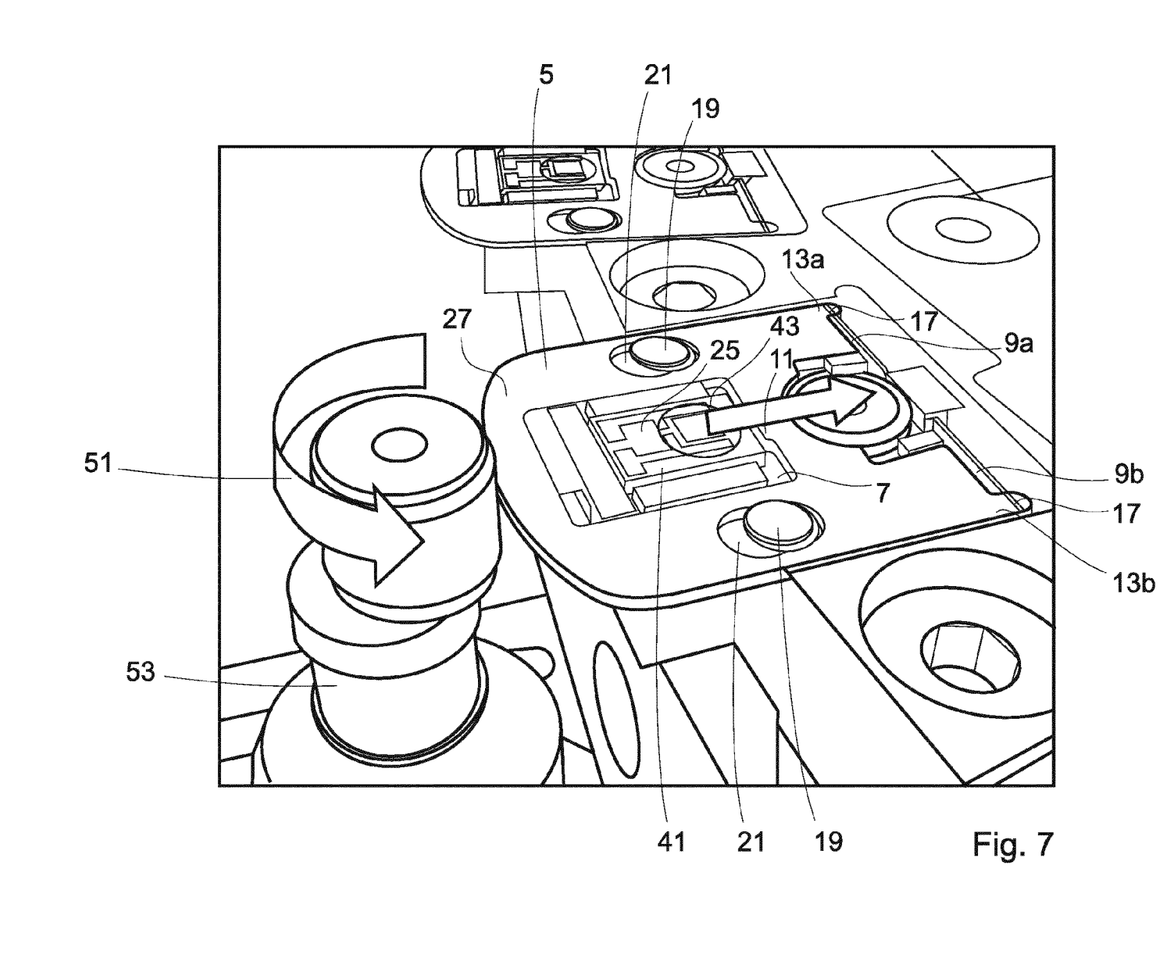
FIGS. 7 and 8 illustrate how the actuator shown in FIG. 6 cooperates with the nest to operate the nest.
Figure 8:
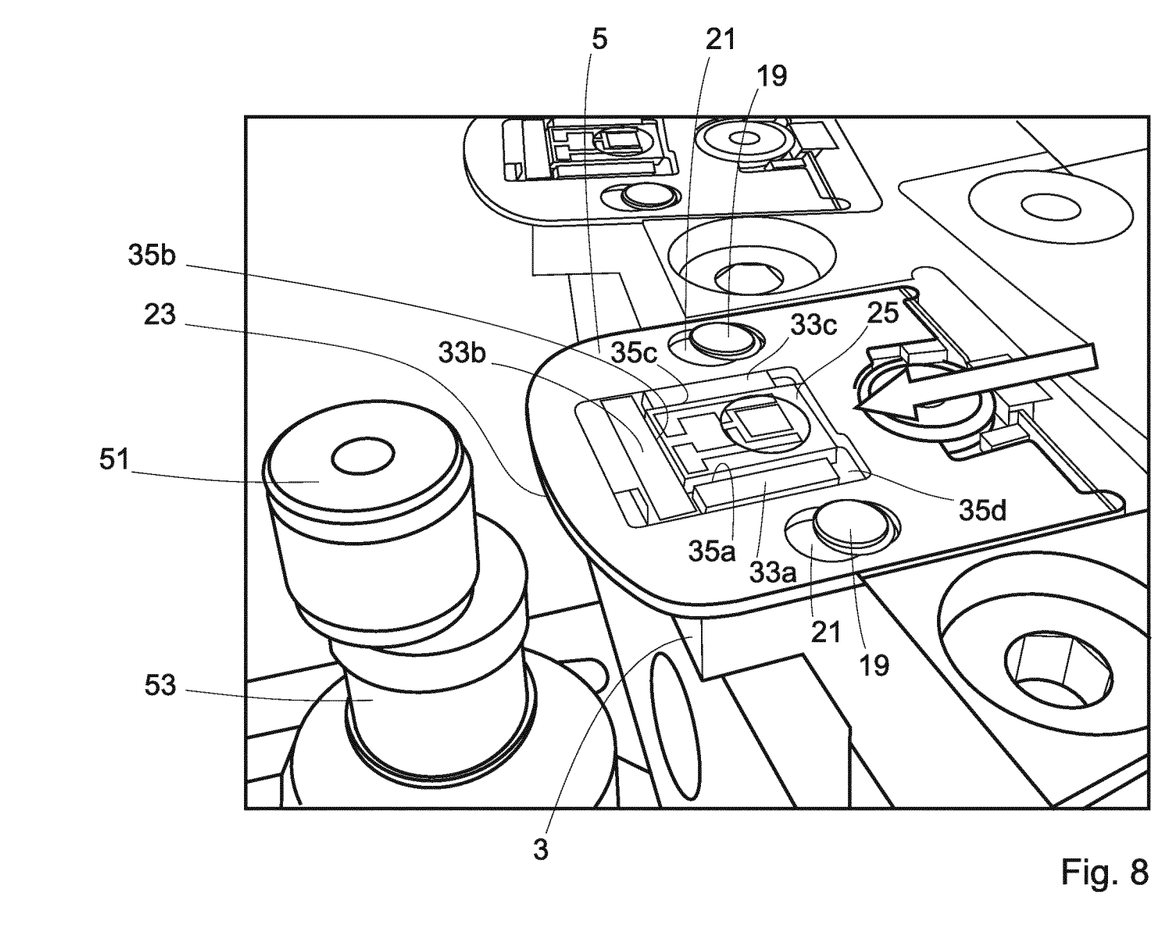

FIGS. 7 and 8 illustrate how the actuator 50 cooperates with the nest 1 to effect operation of the nest 1. The general operation of the assembly will now be described and reference will be made to FIGS. 7 and 8 where appropriate.

During use, the rotatable head 119 is rotated so that a nest 1 on the rotatable head 119 is moved into a horizontal orientation. The rotatable turret 113 rotates so that one of the component handling heads 115, carrying an electrical component 25, is aligned over the nest 1 (preferably over a pocket 7 of the nest 1) on the rotatable head 119.

Referring now to FIGS. 7 and 8, the motor 53 of the actuator 50 operates to rotate the eccentric disc 51 so that the eccentric disk 51 abuts the surface 23 on the ledge 27 of the movable part 5. The rotating eccentric disc 51 pushes the movable part 5 of the nest 1 towards its first position so that the pocket 7 on the nest 1 opens. When the moveable part 5 is moved to its first portion i.e. when the nest 1 is "open", the dimensions of the pocket 7 are increased. Once the nest 1 is open the component handling head 115 releases the component 25 which it carries so that it drops directly into the pocket 7 of the nest 1.

When the electrical component 25 is dropped into the pocket 7, electrical contacts 41 of the electrical component 25 will electrical connect with the electrical contact 111 provided in the nest 1.

As the movable part 5 of the nest 1 is moved towards its first position to open the pocket 7 for the receipt of the electrical component 25, the two projections 13a,b, each of which abuts with first and second flexible blades 9a,b respectively, will push on the free ends 17 of the first and second flexible blades 9a,b to cause flexion of the blades 9a,b. The elastic force of the flexed first and second flexible blades 9a,b will bias the moveable part 5 towards its second position.

Once the electrical component 25 has been positioned within the pocket 7 of the nest 1, the motor 53 of the actuator 50 is operated to rotate the eccentric disc 51 so that eccentric disk 51 no longer abuts the surface 23 on the ledge 27 of the movable part 5. Simultaneously, the biasing force of the flexed first and second flexible blades 9a,b, moves the movable part 5 to its second position so that the nest 1 closes.

When the movable part 5 is in its second position, the extending member 11 (visible in FIG. 7 but not visible in FIG. 8), which is located on the part of the moveable part 5 which defines the fourth wall 35d of the pocket 7, abuts the electrical component 25 located in the pocket 7. The electrical component 25 will also abut the three walls 35a-c defined by the three members 33a-c provided on the fixed part 3. Frictional forces which exist between the extending member 11 and the electrical component 25, and between the electrical component 25 and the three members 33a-c of the fixed portion 3, secures the electrical component 25 within the pocket 7. The electrical component 25 will be secured in the pocket so that the electrical contacts 41 of the electrical component 25 remain in contact with the electrical contacts 111 provided in the nest 1 even when the rotational head 119 is rotated.

Optionally, if the movable part 5a and first and second flexible blades 9a,b are arranged so that when the moveable part 5 is in the second position first and second flexible blades 9a,b are flexed, the electrical component 25 will be clamped, between the moveable part 5 and fixed part 3; clamping of the electrical component 25 will ensure that it is held more securely within the pocket 7.

The two projection members 19 which are fixed to the fixed part 3, move along the tracks 21 which are provided in the movable part 5, as the moveable part 5 moves between its first and second positions. Thus, the cooperation of the projection members 19 and tracks 21 guide the movement of the movable part 5; for example their cooperation prevents rotation of the moveable part 5 with respect to the fixed part 5.

Once the electrical component 25 has been secured within the pocket 7 of the nest 1, the servo motor 114 is operated to rotate the rotatable head 119 about its single axis of rotation 120, at a predefined speed, so that the electrical component 25 is moved at the predefined speed.

The processor 105, which is arranged in electrical communication with the electrical contacts 111 provided in each nest 1, is then operated to send and receive electrical test signals to/from the electrical component 25 held in a nest 1, while the electrical component 25 is rotated by the rotatable head 119. The test signals comprise an electrical command signals which the processor 105 sends to the electrical component 25 to initiate the electrical component 25 to operate in a particular manner or to perform a certain predefined task. The processor 105 in turn will receive electrical response signals from the electrical component 25. The electrical response signals are signals generated by the electrical component 25 when the electrical component 25 is operating or performing the predefined task which was initiated by the electrical command signal. The electrical response signals are then used by the processor 105 to determine the electrical performance of the electrical component 25 while it is rotated by the rotatable head 119.

Optionally, the processor 105 may then be operated to derive, from the determined electrical performance of the electrical component 25, how the electrical component 25 would perform if it was moved in one or more linear directions. For example, the processor 105 can derive how the electrical component 25 would perform if it was moved along the horizontal normal or vertical normal.

Optionally, using the controller 116 the speed of rotation of the rotational head 119 may be accelerated and/or decelerated so that the performance of the electrical component 25, while it is being accelerated and/or decelerated, may also be determined.

Preferably the turret 113 will rotate intermittently, and rotation of the handling head 119 is synchronized with the rotation of the turret 113, so that the performance of the electrical component 25 is determined, during intervals in which the turret is stopped.

The rotatable head assembly 118 described above will preferably define one of a plurality of testing stations which are arranged at a periphery of the rotatable turret 113. The rotatable turret 113 is configured to intermittently rotate to transport electrical components 25 between the plurality of testing stations which are located at its periphery; for each testing station a component handling head 115 will deliver an electrical component 25 to an underlying testing station, where testing of the electrical component 25 will take place; after testing is complete the component handling head 115 will pick the electrical component 25 from respective test station and the rotatable turret 113 will then rotate a single iteration so that the electrical component 25 can be delivered to the next testing station.

Figure 9:
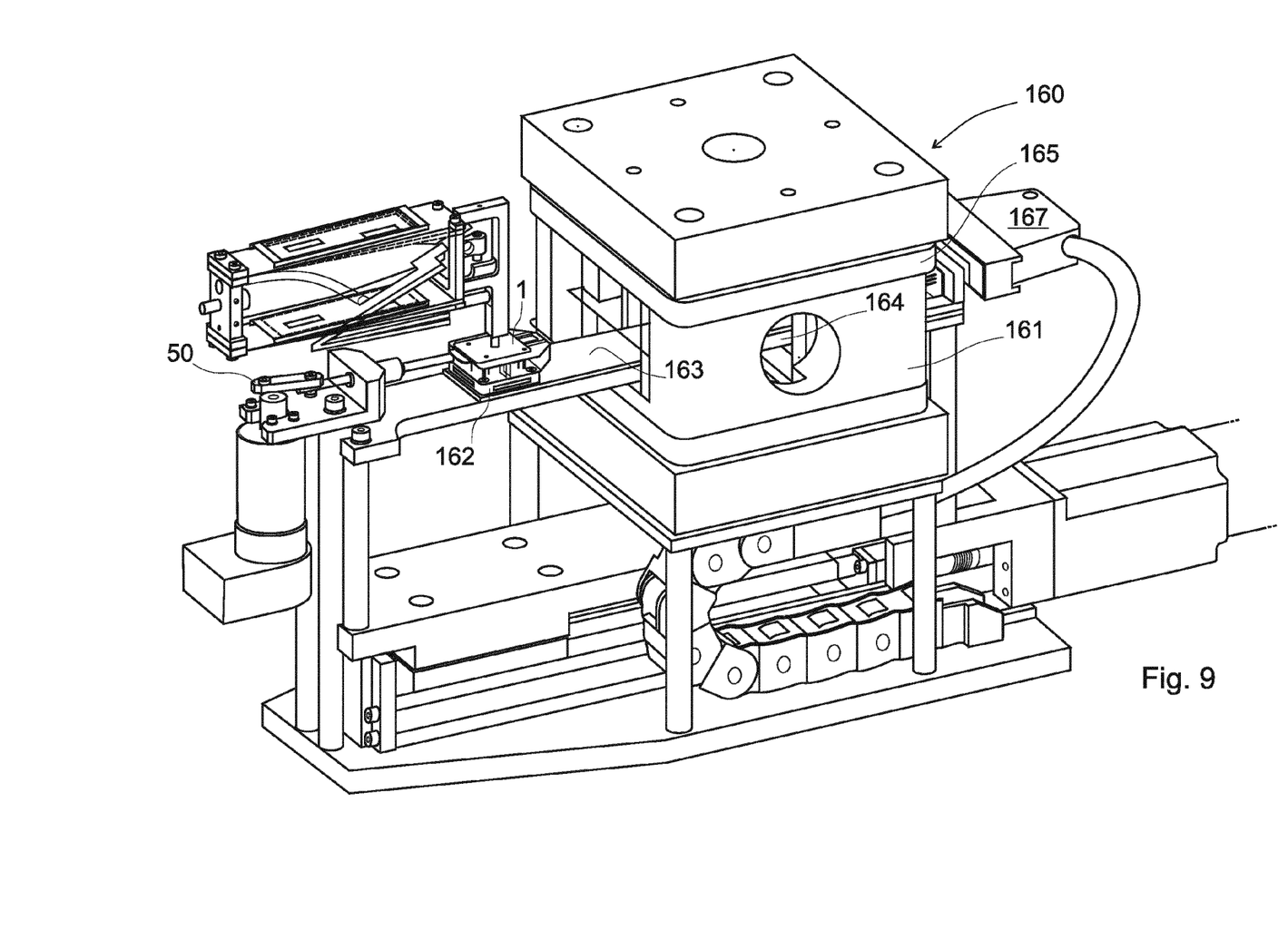
FIG. 9 provides a perspective view of a magnetic testing assembly which can form part of the assembly shown in FIG. 1.

In addition to the rotatable head assembly 118 which shown in FIG. 2, the assembly 1 of FIG. 1, may further comprise a magnetic testing station, for testing the performance of electrical components 25 when subjected to a magnetic field. An exemplary magnetic testing station 160 is shown in FIG. 9. The magnetic testing station 160 will preferably define one of a plurality of testing stations which are arranged at a periphery of the rotatable turret 113 in the assembly 1 shown in FIG. 1.

The magnetic testing station 160 comprises an electromagnet 161. The magnetic testing station 160 further comprises a carriage 162. The carriage 162 comprises a nest 1 which may some or all of the features of the nest 1 shown in FIGS. 3-8. The magnetic testing station 160 will be arranged such that the nest 1 on the carriage 162 is located under a component handling head 115 of the rotatable turret 113 so that an electrical component 25 can be passed directly from the rotatable turret 113 into a pocket 7 of the nest 1 on the carriage 162. The magnetic testing station 160 further comprises an actuator 50 which is operable to open and close the pocket 7 of the nest 1 in the manner previously described.

The carriage 162 runs on a track 163 which leads into a testing region 164 within the electromagnet 161. The testing region 164 is a region within the electromagnet 161 with is submerged in a magnetic field generated by the electromagnet 161. The carriage 162 can be moved along the track 163 to carry an electrical component 25 which is located in the nest 1 of the carriage 162, into the testing region 164 so that the electrical component 25 will be submerged in the magnetic field generated by the electromagnet 161.

The processor 105 of the assembly 1 may be arranged to also be in electrical communication with the electrical contacts 111 of the nest 1 provided on the carriage 162, such that the processor 105 can send and receive electrical test signals to/from an electrical component 25 which is located in the testing region 164 submerged in the magnetic field generated by the electromagnet 161.

The test signals may, for example, comprise electrical command signals which the processor 105 sends to the electrical component 25 to initiate the electrical component 25 to operate in a particular manner or to perform a certain predefined task. The processor 105 may in turn receive electrical response signals from the electrical component 25; the electrical response signals may be signals which are generated by the electrical component 25 when the electrical component 25 is operating or performing the predefined task which was initiated by the electrical command signal. The electrical response signals are used by the processor 105 to determine how the electrical component 25 is performing while being subjected to a magnetic field.

The magnetic testing station 160 further comprise a means 167 for adjusting the magnitude of current which is conducted in an electrical coil 165 of the electromagnet 161. This will enable the strength of the magnetic field to be adjusted, thus allowing the performance of the electrical component 25, when subjected to various strength magnetic fields, to be determined.

During use the rotatable turret 113 rotates so that one of the component handling heads 115, carrying an electrical component 25, is aligned over a pocket 7 of the nest 1 provided on the carriage 162. The nest 1 will have exactly the same features as nest 1 described earlier, and will be opened, using the actuator 50, in the manner described earlier.

When the electrical component 25 is dropped into the pocket 7 of the nest 1 on the carriage 162, electrical contacts 41 on the electrical component 25 will form an electrical connection with electrical contacts 111 provided in the nest 1 on the carriage 162. The nest 1 will be closed in a same manner as described above, to secure the electrical component 25 within the nest 1 on the carriage 162.

Once the electrical component 25 is secured a predetermined current is passed though the conducting coil 165 of the electromagnet 161 so that a predetermined magnetic field is generated in the testing region 164 within the electromagnet 161. The carriage 162 is then moved along the track 163 to carry the electrical component 25 into the testing region 164, so that the is submerged in the magnetic field.

The processor 105, which is arranged in electrical communication with the electrical contacts 111 provided in each nest 1 on the carriage 162, is then operated to send and receive electrical test signals to/from the electrical component 25 while the component electrical component 25 is submerged in the magnetic field. The test signals comprise an electrical command signals which the processor 105 sends to the electrical component 25 to initiate the electrical component 25 to operate in a particular manner or to perform a certain predefined task. The processor 105 in turn will receive electrical response signals from the electrical component 25. The electrical response signals are signals generated by the electrical component 25 when the electrical component 25 is operating or performing the predefined task which was initiated by the electrical command signal. The electrical response signals are then used by the processor 105 to determine how the electrical component 25 performed in the presence of a magnetic field.

Optionally the magnitude of the current in the conducting coil 165 of the electromagnet 161 may be varied or adjust to vary of adjust the strength of the magnetic field which the electrical component 25 is subjected to. Thus, the performance of the electrical component 25, when subjected to various strength magnetic fields, can be determined.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. An assembly for testing performance of a component, the assembly comprising,
    a rotatable turret which comprises a plurality of component handling heads each of which can hold a component;
    a rotatable head assembly, the rotatable head assembly comprising, a rotatable head, wherein the rotatable head comprises one or more nests, each of which has an electrical contact, and each of the one or more nests is suitable for receiving a component such that the component can electrically connect to the electrical contact of that nest;
    wherein the nest is further configured such that it can hold a component such that the component remains electrically connected to the electrical contact, as the rotatable head rotates;
    wherein the rotatable head is arranged to be adjacent the turret so that a component can be passed directly from a component handling head on the rotatable turret to a nest on the rotatable head;
    a processor which is arranged in electrical communication with the electrical contact(s) of the one or more nests on the rotatable head such that the processor can, both, send command signals to a component held in a nest which cause the component to operate in a predefined manner, and receive response signals from the component which are generated by the component when the component operates in the predefined manner, while the component is rotated by the rotatable head, and
    wherein the processor is configured to determine the performance of the component from the response signals it receives.

2. The assembly according to claim 1 wherein the rotatable head assembly is arranged such that the rotatable head is positioned under the rotatable turret, so that a component can be passed directly from a component handling head on the rotatable turret into a nest on the rotatable head.

3. The assembly according to claim 1 wherein the rotatable head is configured to have a single axis of rotation only.

4. The assembly according to claim 1 wherein the processor is further configured to derive, from the determined performance of the component, the performance of the component if it were moved in one or more linear directions.

5. The assembly according to claim 1 wherein the rotatable head assembly further comprises a controller which is operable to control the speed of rotation of the rotatable head.

6. The assembly according to claim 1 wherein the rotatable head comprises two or more nests.

7. The assembly according to claim 1 wherein the one or more nests in the rotatable head assembly each comprise, a fixed part, and a movable part, wherein the fixed part and movable part are configured to cooperate so as to define a pocket which can receive at least a part of a component, wherein the movable part is moveable between a first position and a second position, wherein in the first position the pocket is open so that at least part of the component can be moved into the pocket and electrically connect to an electrical contact provided in the nest, and in the second position the pocket is closed so that the at least part of the component positioned in the pocket can be secured within the pocket, wherein the nest further comprises a biasing means which is arranged to bias the movable part towards its second position so that a component can be maintained electrically connected to the electrical contact provided in the nest, as the rotatable head rotates.

8. The assembly according to claim 7 wherein the rotatable head assembly further comprises an actuator which is operable to effect opening and closing of the pocket of the nest.

9. The assembly according to claim 1 wherein the assembly for testing performance of a component, further comprises a magnetic testing station, the magnetic testing station comprising,
    an electromagnet which is operable by current to provide an magnetic field;
    a carriage, which comprises a nest which has an electrical contact and which is suitable to hold a component in electrical connection with the electrical contact of that nest, and wherein the carriage is movable to carry a component received in the nest, to a region where the component is submerged in a magnetic field generated by the electromagnet;
    a processor which is arranged in electrical communication with the electrical contact of the nest on the carriage such that the processor can, both, send command signals to a component held in the nest which cause the component to operate in a predefined manner, and receive response signals from the component which are generated by the component when the component operates in the predefined manner, while the component is submerged in the magnetic field, and
    wherein the processor is configured to determine the performance of the component from the response signals it receives.

10. The assembly according to claim 9 wherein the carriage is configured such that it can be positioned adjacent to the rotatable turret so that a component can be passed directly from a component handling head on the rotatable turret to a nest on carriage.

11. The assembly according to claim 9 wherein the magnetic testing station further comprises a means for adjusting the strength of the magnetic field, wherein the means for adjusting the strength of the magnetic field comprises a means for adjusting the magnitude of the current which is conducted in an electrical coil of the electromagnet.

12. A method of testing the performance of a component comprising the steps of,
transferring a component to be tested, from a handling head on a rotatable turret, directly to a nest on a rotatable head which is arranged adjacent the turret, so that the component establishes electrical connection with an electrical contact provided in the nest;
operating the nest to hold the component so that the component remains electrically connected to the electrical contact as the rotatable head rotates;
rotating the rotatable head at a predetermined speed;
operating a processor which is arranged in electrical communication with the electrical contact of the nest, such that the processor sends command signals to the component held in the nest, to cause the component to operate in a predefined manner, and
receiving at the processor, response signals from the component which are generated by the component when the component operates in the predefined manner, while the component is rotated by the rotatable head,
determining the performance of the component from the response signals the processor receives.

13. A method according to claim 12 further comprising the step of, operating the processor to derive from the determined performance of the component, the performance of the component if it were to be moved along one or more linear directions.

14. A method according to claim 12 further comprising the steps of, securing the component in a nest by moving a moveable part of the nest to a first position against a biasing means; positioning at least part of the component into a pocket of the nest so that the component establishes electrical connection with an electrical contact provided in the nest; moving the moveable part to a second position using a biasing means so that the component, at least part of which is located in the pocket, is secured within the pocket so that the component can be maintained electrically connected to the electrical contacts, as the rotatable head rotates.

15. A method according to claim 12 further comprise the steps of,
transferring a component to be tested, from a handling head on a rotatable turret, directly to a nest on a carriage which is positioned adjacent the turret, so that the component establishes electrical connection with an electrical contact provided in the nest;
operating the nest to hold the component;
operating an electromagnet to generate an predetermined magnetic field;
moving the carriage so that the component is carried by the carriage into a region where it is submerged in the generated magnetic field;
operating a processor which is arranged in electrical communication with the electrical contact such that the processor sends command signals to the component held in a nest which cause the component to operate in a predefined manner, and receiving at the processor, response signals from the component which are generated by the component when the component operates in the predefined manner, while the component is submerged in the generated magnetic field,
determining the performance of the component from the response signals the processor receives.

* * * * *